United States Patent
Hsu

(10) Patent No.: US 8,581,107 B2
(45) Date of Patent: Nov. 12, 2013

(54) HALOGEN-FREE FLAME-RETARDANT EPOXY RESIN COMPOSITION, AND PREPREG AND PRINTED CIRCUIT BOARD USING THE SAME

(75) Inventor: Hsuan Hao Hsu, Zhubei (TW)

(73) Assignee: Taiwan Union Technology Corporation, Zhubei, Hsinchu County (TW)

( * ) Notice: Subject to any disclaimer, the term of this patent is extended or adjusted under 35 U.S.C. 154(b) by 286 days.

(21) Appl. No.: 12/856,123

(22) Filed: Aug. 13, 2010

(65) Prior Publication Data

US 2011/0278052 A1    Nov. 17, 2011

(30) Foreign Application Priority Data

May 12, 2010 (TW) ................................ 99115106 A

(51) Int. Cl.
*H05K 1/00* (2006.01)
(52) U.S. Cl.
USPC ............. 174/258; 174/110 R; 174/110 SR; 174/110 SY; 174/110 E; 524/123

(58) Field of Classification Search
USPC ........ 174/250, 255–256, 258, 110 R, 110 SY, 174/119 A, 120 SR, 121 A, 121 R, 121 SR
See application file for complete search history.

(56) References Cited

U.S. PATENT DOCUMENTS

| 6,534,181 | B2 | 3/2003 | Luttrull | |
|---|---|---|---|---|
| 2003/0207969 | A1* | 11/2003 | Capocci et al. | 524/236 |
| 2004/0025743 | A1* | 2/2004 | Wakizaka et al. | 106/18.11 |
| 2005/0014875 | A1* | 1/2005 | Knop et al. | 524/126 |
| 2008/0073629 | A1* | 3/2008 | Chen | 252/609 |
| 2009/0082494 | A1* | 3/2009 | Kaprinidis | 524/101 |

FOREIGN PATENT DOCUMENTS

TW     455613     9/2001

* cited by examiner

*Primary Examiner* — Courtney Smith
(74) *Attorney, Agent, or Firm* — Muncy, Geissler, Olds & Lowe, PLLC

(57) ABSTRACT

Disclosed is a halogen-free flame-retardant epoxy resin composition for printed circuit board, which includes (A) a halogen-free epoxy resin; (B) a copolymer of styrene and maleic anhydride used as a first curing agent; (C) poly(1,3-phenylene methylphosphonate) used as a second curing agent; (D) a curing accelerator; and (E) an inorganic filler.

14 Claims, No Drawings

HALOGEN-FREE FLAME-RETARDANT EPOXY RESIN COMPOSITION, AND PREPREG AND PRINTED CIRCUIT BOARD USING THE SAME

BACKGROUND OF THE INVENTION

1. Field of the Invention

The present invention relates to an epoxy resin composition, and a prepreg and a printed wiring board using the epoxy resin composition, and more particularly to a halogen-free flame-retardant epoxy resin composition having improved processability and fracture toughness required for manufacturing a printed circuit board (PCB), and a prepreg impregnated with such a composition and a printed circuit board manufactured by using such a prepreg.

2. The Prior Arts

The use of a copolymer of styrene and maleic anhydride (SMA) as a curing agent for epoxy resin in an epoxy resin composition was described in U.S. Pat. No. 6,534,181 and TW 455613. A drawback to such epoxy resin compositions is that they have low Tg and low thermal stability, rendering them unsuitable for use in prepregs, which are applied in laminates for printed circuit boards (PCBs).

Prepregs are widely employed in the manufacture of laminates for printed circuit boards. For manufacturing a prepreg, in general, a substrate was impregnated with a varnish prepared by dissolving a thermosetting resin, such as epoxy resin, in a solvent, followed by partial curing of the resin, and such a substrate with impregnated and partially cured resin is commonly referred to as a prepreg. For manufacturing a printed circuit board, in general, it involves laminating a particular number of layers of the prepregs, and forming a metal foil additionally on at least one outermost layer, and forming a particular circuit pattern on the surface of the metal-clad laminate by etching the metal foil thereon.

However, processing prepregs into printed circuit boards usually involves their being cut down to size and laminated. Both these process steps make stringent demands on the resin with which the substrate is impregnated. For instance, the partially cured resin has to have sufficient sturdiness during the processing of prepregs into printed circuit boards.

In this connection resin compositions where the epoxy resin is cured with an anhydride-containing copolymer have the drawback of being too brittle to be processed as prepregs. For instance, it proves impossible to cut up such prepregs without a portion of the resin blowing about in the form of a large quantity of dry dust.

In the prior art, there were some methods for enhancing the toughness of the epoxy resins. Among which, the method for adding toughening agents was one effective method for toughening the epoxy resins. Toughness of the epoxy resin could be significantly increased with the addition of a thermoplastic resin having a molecular weight of larger than 5000, such as a phenoxy resin, or a carboxyl-terminated butadiene-acrylonitrile (CTBN) elastomer, which results in the decrease of the amount of resin dust during the processing of prepregs into printed circuit boards. However, adding toughening agents had an adverse effect on the heat resistance, dielectric properties, and bonding strength of the epoxy resins.

Therefore, there still exists a need for providing a resin composition where the problem of brittleness, which occurs when a copolymer of styrene and maleic anhydride is used as epoxy curing agent, can be prevented. Meanwhile, the resin composition based on epoxy resin cross-linked with styrene maleic anhydride copolymer (SMA) can have improved thermal, dielectric properties, and bonding strength.

SUMMARY OF THE INVENTION

Accordingly, the objective of the present invention is to provide a halogen-free flame-retardant epoxy resin composition which has superior processability and toughness, while having high glass transition temperature, high heat resistance, high peeling strength to copper foil, high flame retardancy, low water absorption, and low dielectric properties as indicated by Dk and Df, and also to provide a prepreg and a printed circuit board prepared from such an epoxy resin composition.

To achieve the above objective, the present invention provides to a halogen-free flame-retardant epoxy resin composition comprising:
(A) a halogen-free epoxy resin having at least two epoxy groups in one molecule;
(B) 10.0 to 20.0 parts by weight of a copolymer of styrene and maleic anhydride as a first curing agent, based on 100 parts by weight of the halogen-free epoxy resin, and the copolymer of styrene and maleic anhydride is represented by the following general formula (I):

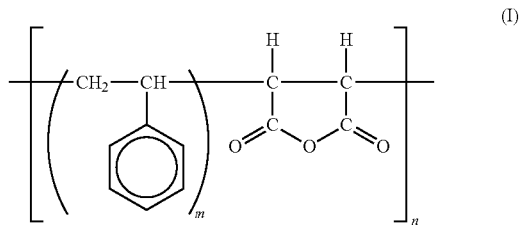

where m is an integer of 1 to 6, and n is an integer of 2 to 12; and
(C) 25.0 to 70.0 parts by weight of poly(m-phenylene methylphosphonate) as a second curing agent, based on 100 parts by weight of the halogen-free epoxy resin, and poly(m-phenylene methylphosphonate) is represented by the following general formula (II):

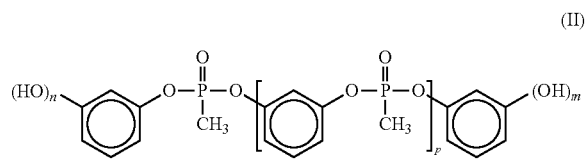

where m and n are 0 or 1, and p is an integer such that the number average molecular weight is less than 1000,
wherein a weight ratio of poly(m-phenylene methylphosphonate) to the copolymer of styrene and maleic anhydride is 2:1 to 4:1

The epoxy resin composition of the present invention can preferably include a curing accelerator additionally.

The epoxy resin composition of the present invention can preferably further include an inorganic filler.

The present invention further provides a prepreg produced by impregnating a reinforcing material with the epoxy resin composition of the present invention to form an impregnated substrate, and drying the impregnated substrate to a semi-cured state.

The present invention yet further provides a printed circuit board produced by laminating a particular number of the prepregs of the present invention to form a prepreg laminate, and forming a metal foil on at least one outermost layer of the prepreg laminate and heat pressure-molding the prepreg laminate to form a metal-clad laminate, and forming a particular circuit pattern on the surface of the metal foil on the metal-clad laminate.

The objective, characteristics, aspects, and advantages of the present invention will become more evident in the following detailed description.

DETAILED DESCRIPTION OF THE PREFERRED EMBODIMENT

In the present embodiment, the halogen-free flame-retardant epoxy resin composition for the printed circuit board comprises:

(A) 100 parts by weight of a halogen-free epoxy resin having at least two epoxy groups in one molecule;
(B) 10.0 to 20.0 parts by weight of a copolymer of styrene and maleic anhydride represented by the following general formula (I) as a first curing agent:

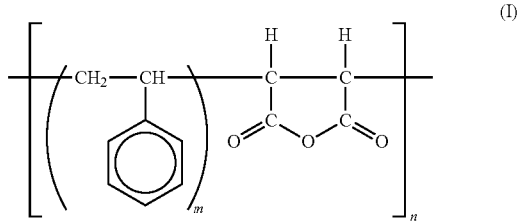

where m is an integer of 1 to 6, and n is an integer of 2 to 12; and
(C) 25.0 to 70.0 parts by weight of poly(m-phenylene methylphosphonate) represented by the following general formula (II) as a second curing agent:

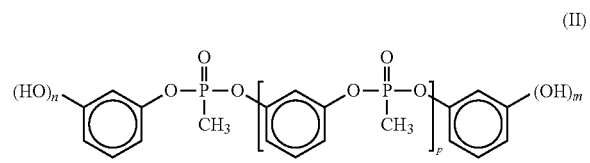

where m and n are 0 or 1, and p is an integer such that the number average molecular weight is less than 1000;
(D) 0.01 to 1.0 parts by weight of a curing accelerator; and
(E) 5.0 to 30.0 parts by weight of an inorganic filler, wherein the weight ratio of poly(m-phenylene methylphosphonate) to a copolymer of styrene and maleic anhydride is in the range of from 2:1 to 4:1, and preferably 2.7:1. The parts by weight of components (B), (C), (D), and (E) are based on 100 parts by weight of the halogen-free epoxy resin (component (A)).

The halogen-free epoxy resin (A) used in the halogen-free flame-retardant epoxy resin composition of the present invention has at least two epoxy groups in one molecule. Examples of the epoxy resin used in the present invention include, but are not limited to, (1) nitrogen-containing epoxy resin, such as benzoxazine-epoxy resin, and triazine groups-containing epoxy resin; and (2) phosphorus-containing epoxy resin, such as DOPO-PNE which is obtained by reacting 10-dihydro-9-oxa-10-phosphahenanthrene-10-oxide (DOPO) with phenol novolac epoxy resin (PNE), wherein DOPO has the following structure:

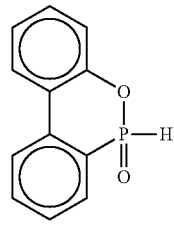

These above-mentioned epoxy resins can be used singly or in combination of two or more of them.

The first curing agent (B) used in the halogen-free flame-retardant epoxy resin composition of the present invention comprises a copolymer of styrene and maleic anhydride (SMA). The copolymer of styrene and maleic anhydride has a molecular weight in the range of about 1400 to about 50,000 and an anhydride content of more than 15% by weight. Examples of such copolymers include the commercially available SMA 1000, SMA 2000, SMA 3000, and SMA 4000. These copolymers have a styrene:maleic anhydride ratio of 1:1, 2:1, 3:1, and 4:1, respectively, and a molecular weight ranging from 1400 to 2000. These copolymers of styrene and maleic anhydride can be used singly or in combination of two or more of them. The first curing agent is present in the halogen-free flame-retardant epoxy resin composition of the present invention in an amount from 10.0 to 20.0 parts by weight, based on 100 parts by weight of the halogen-free epoxy resin.

The second curing agent (C) used in the halogen-free flame-retardant epoxy resin composition of the present invention comprises poly(m-phenylene methylphosphonate) which also serves as a flame retardant. The number average molecular weight of poly(m-phenylene methylphosphonate) for use is less than 1000; so that poly(m-phenylene methylphosphonate) is in the form of liquid. The second curing agent is present in the halogen-free flame-retardant epoxy resin composition of the present invention in an amount from 25.0 to 70.0 parts by weight, based on 100 parts by weight of the halogen-free epoxy resin.

Other curing agents used in the halogen-free flame-retardant epoxy resin composition of the present invention can comprise a primary amine additionally. Examples of the primary amine used in the present invention include, but are not limited to, diaminodiphenylsulfone (DDS), and dicyandiamide (DICY).

The copolymer of styrene and maleic anhydride, poly(m-phenylene methylphosphonate), and optional diaminodiphenylsulfone or dicyandiamide can undergo a cross-linking reaction with the epoxy resin to form an interpenetrating polymeric network. The weight ratio of poly(m-phenylene methylphosphonate) to a copolymer of styrene and maleic anhydride is in the range of from 2:1 to 4:1, and preferably 2.7:1.

The curing accelerator (D) used in the halogen-free flame-retardant epoxy resin composition of the present invention can be any compound that is used for accelerating the curing of an epoxy resin. Examples of the curing accelerator used in the present invention include, but are not limited to, imidazoles, more particularly alkyl substituted imidazoles such as 2-methylimidazole and 2-ethyl-4-methylimidazole, 2-phenylimidazole, 2-phenyl, 4-methylimidazole. Other suitable accelerators include tertiary amines, e.g. benzyldimethylamine and 4,4' and 3,3' diaminodiphenylsulphone. These curing accelerators can be used singly or in combination of two or more of them. One preferred curing accelerator is 2-methylimidazole. The amount of curing accelerator used is dependent on the type of epoxy resin, the type of curing agent, and the type of curing accelerator. The curing accelerator is present in the halogen-free flame-retardant epoxy resin composition of the present invention in an amount from 0.01 to 1.0 parts by weight, based on 100 parts by weight of the halogen-free epoxy resin.

The inorganic filler (E) used in the halogen-free flame-retardant epoxy resin composition of the present invention serves to impart additional flame retardancy, heat resistance and humidity resistance to the epoxy resin composition. Examples of the inorganic filler used in the present invention include, but are not limited to, silica, silicon carbide, silicon nitride, boron nitride, calcium carbonate, barium sulfate, calcium sulfate, mica, talc, clay, alumina, magnesium oxide, zirconium oxide, aluminium hydroxide, magnesium hydroxide, calcium silicate, aluminum silicate, lithium aluminum silicate, zirconium silicate, and molybdenum disulfide. These inorganic fillers can be used singly or in combination of two or more of them. Preferred inorganic fillers include silica, talc, and aluminium hydroxide. If the inorganic filler exists in the halogen-free flame-retardant epoxy resin composition of the present invention, it is present in an amount between 5.0 to 30.0 parts by weight, based on 100 parts by weight of the halogen-free epoxy resin.

One or more solvents can be used for preparing the epoxy resin composition varnish in the present invention in order to provide resin solubility, and control resin viscosity. Examples of the solvents used in the present invention include, but are not limited to, acetone, methylethylketone, propylene glycol methyl ether, cyclohexanone, propylene glycol methyl ether acetate. These solvents can be used singly or in combination of two or more of them. Preferred solvents include methylethylketone, and propylene glycol methyl ether. The solvent is present in the halogen-free flame-retardant epoxy resin composition of the present invention in an amount from about 20.0 to 50.0 parts by weight, based on 100 parts by weight of the epoxy resin.

If necessary, various additives such as silane coupling agents, and releasants can be used in the halogen-free flame-retardant epoxy resin composition of the present invention.

The halogen-free flame-retardant epoxy resin composition of the present invention can be prepared by blending the components (A), (B), (C), (D), and (E), and then agitating the mixture uniformly, for example, in a mixer or blender.

The epoxy resin composition varnish of the present invention is prepared by dissolving or dispersing the obtained epoxy resin composition in a solvent.

A reinforcing material is impregnated with the resin varnish to form an impregnated substrate, and then the impregnated substrate is heated in a dryer at 150 to 180° C. for 2 to 10 minutes to give a prepreg in a semi-cured state (B-stage). Examples of the reinforcing material used in the present invention include, but are not limited to, glass fiber cloth, glass paper and glass mat, and also, kraft paper and linter paper.

A metal-clad laminate is prepared by laminating a particular number of the prepregs thus obtained, placing a metal foil additionally on at least one outermost layer and molding the composite under heat and pressure. As for the heat pressure-molding condition, the temperature is 160 to 190° C., the molding pressure is 10 to 30 kg/cm$^2$, and the molding time is 30 to 120 minutes. Then, a metal-clad laminate used for production of printed wiring boards is formed under such heat and pressure conditions. Examples of the metal foils used in the present invention include, but are not limited to, copper foil, aluminum foil, and stainless steel foil.

A circuit pattern formed on the surface of the metal-clad laminate is obtained by leaving circuit pattern-forming regions and removing the other regions thereof by using the subtractive process, otherwise known as the etching process. In this way, a printed wiring board carrying a circuit on the surface is obtained.

Hereinafter, the present invention will be described in more detail with reference to Examples. It should be understood that the present invention is not restricted at all by these Examples.

<Preparation of Epoxy Resin Composition Varnishes>

EXAMPLE 1

100 parts by weight of DOPO-PNE (KOLON 5138, manufactured by Kolon Chemical Co., epoxy equivalence of 250 to 390 g/eq), 15 parts by weight of a copolymer of styrene and maleic anhydride (SMA EF40, manufactured by Sartomer Co., anhydride equivalence of 393 g/eq), 40 parts by weight of poly(m-phenylene methylphosphonate) (Fyrol PMP, hydroxyl group equivalence of 90 g/eq), 0.5 parts by weight of 2-methylimidazole, and 15 parts by weight of silica were mixed together by a mixer at room temperature for 60 minutes, and then the obtained mixture was dissolved in 30 parts by weight of methylethylketone, followed by stirring in a disperser at room temperature for 120 minutes to give the epoxy resin composition varnish.

EXAMPLE 2

100 parts by weight of DOPO-PNE (KOLON 5138, manufactured by Kolon Chemical Co., epoxy equivalence of 250 to 390 g/eq), 15 parts by weight of a copolymer of styrene and maleic anhydride (SMA EF40, manufactured by Sartomer Co., anhydride equivalence of 393 g/eq), 30 parts by weight of poly(m-phenylene methylphosphonate) (Fyrol PMP, hydroxyl group equivalence of 90 g/eq), 0.5 parts by weight of 2-methylimidazole, and 15 parts by weight of silica were mixed together by a mixer at room temperature for 60 minutes, and then the obtained mixture was dissolved in 30 parts by weight of methylethylketone, followed by stirring in a disperser at room temperature for 120 minutes to give the epoxy resin composition varnish.

EXAMPLE 3

100 parts by weight of DOPO-PNE (KOLON 5138, manufactured by Kolon Chemical Co., epoxy equivalence of 250 to 390 g/eq), 15 parts by weight of a copolymer of styrene and maleic anhydride (SMA EF40, manufactured by Sartomer Co., anhydride equivalence of 393 g/eq), 60 parts by weight of poly(m-phenylene methylphosphonate) (Fyrol PMP, hydroxyl group equivalence of 90 g/eq), 0.5 parts by weight of 2-methylimidazole, and 15 parts by weight of silica were mixed together by a mixer at room temperature for 60 minutes, and then the obtained mixture was dissolved in 30 parts by weight of methylethylketone, followed by stirring in a disperser at room temperature for 120 minutes to give the epoxy resin composition varnish.

EXAMPLE 4

100 parts by weight of DOPO-PNE (KOLON 5138, manufactured by Kolon Chemical Co., epoxy equivalence of 250 to 390 g/eq), 20 parts by weight of a copolymer of styrene and maleic anhydride (SMA EF40, manufactured by Sartomer Co., anhydride equivalent of 393 g/eq), 10 parts by weight of diaminodiphenylsulfone (hydroxyl group equivalence of 62 g/eq), 54 parts by weight of poly(m-phenylene methylphosphonate) (Fyrol PMP, hydroxyl group equivalence of 90 g/eq), 0.5 parts by weight of 2-methylimidazole, and 15 parts by weight of silica were mixed together by a mixer at room temperature for 60 minutes, and then the obtained mixture was dissolved in 30 parts by weight of methylethylketone, followed by stirring in a disperser at room temperature for 120 minutes to give the epoxy resin composition varnish.

EXAMPLE 5

100 parts by weight of DOPO-PNE (KOLON 5138, manufactured by Kolon Chemical Co., epoxy equivalence of 250 to 390 g/eq), 10 parts by weight of a copolymer of styrene and maleic anhydride (SMA EF40, manufactured by Sartomer Co., anhydride equivalent of 393 g/eq), 27 parts by weight of poly(m-phenylene methylphosphonate) (Fyrol PMP, hydroxyl group equivalence of 90 g/eq), 0.25 parts by weight of 2-methylimidazole, and 15 parts by weight of silica were mixed together by a mixer at room temperature for 60 minutes, and then the obtained mixture was dissolved in 30 parts by weight of methylethylketone, followed by stirring in a disperser at room temperature for 120 minutes to give the epoxy resin composition varnish.

EXAMPLE 6

100 parts by weight of DOPO-PNE (KOLON 5138, manufactured by Kolon Chemical Co., epoxy equivalence of 250 to 390 g/eq), 10 parts by weight of a copolymer of styrene and maleic anhydride (SMA EF40, manufactured by Sartomer Co., anhydride equivalent of 393 g/eq), 5 parts by weight of diaminodiphenylsulfone (hydroxyl group equivalence of 62 g/eq), 30 parts by weight of poly(m-phenylene methylphosphonate) (Fyrol PMP, hydroxyl group equivalence of 90 g/eq), 0.5 parts by weight of 2-methylimidazole, and 15 parts by weight of silica were mixed together by a mixer at room temperature for 60 minutes, and then the obtained mixture was dissolved in 30 parts by weight of methylethylketone, followed by stirring in a disperser at room temperature for 120 minutes to give the epoxy resin composition varnish.

COMPARATIVE EXAMPLE 1

100 parts by weight of DOPO-PNE (KOLON 5138, manufactured by Kolon Chemical Co., epoxy equivalence of 250 to 390 g/eq), 15 parts by weight of a copolymer of styrene and maleic anhydride (SMA EF40, manufactured by Sartomer Co., anhydride equivalent of 393 g/eq), 0.5 parts by weight of 2-methylimidazole, and 15 parts by weight of silica were mixed together by a mixer at room temperature for 60 minutes, and then the obtained mixture was dissolved in 30 parts by weight of methylethylketone, followed by stirring in a disperser at room temperature for 120 minutes to give the epoxy resin composition varnish.

COMPARATIVE EXAMPLE 2

100 parts by weight of DOPO-PNE (KOLON 5138, manufactured by Kolon Chemical Co., epoxy equivalence of 250 to 390 g/eq), 15 parts by weight of a copolymer of styrene and maleic anhydride (SMA EF40, manufactured by Sartomer Co., anhydride equivalent of 393 g/eq), 70 parts by weight of poly(m-phenylene methylphosphonate) (Fyrol PMP, hydroxyl group equivalence of 90 g/eq), 0.5 parts by weight of 2-methylimidazole, and 15 parts by weight of silica were mixed together by a mixer at room temperature for 60 minutes, and then the obtained mixture was dissolved in 30 parts by weight of methylethylketone, followed by stirring in a disperser at room temperature for 120 minutes to give the epoxy resin composition varnish.

<Preparation of Prepregs>

The 7628 (R/C: 43%) glass fiber cloths (product of Nitto Boseki Co., Ltd) were respectively impregnated with the resin varnish obtained in Examples 1 to 6 and Comparative Examples 1 to 2 at room temperature, and followed by heating the impregnated glass fiber cloths at approximately 180° C. for 2 to 10 minutes to remove the solvent in the resin varnish (here, the resulting epoxy resin compositions were semi-cured) to obtain the prepregs of Examples 1 to 6 and Comparative Examples 1 to 2.

<Preparation of Printed Circuit Boards>

Four prepregs (300 mm×510 mm) of Example 1 were held and laminated between two copper foils (thickness: 1 oz, product of Nikko Gould Foil Co., Ltd.), to give a laminate. The laminate was then molded under the heating/pressurization condition of the temperature of 180° C. (the programmed heating rate of 2.0° C./minutes) and the pressure of 15 kg/cm² (an initial pressure: 8 kg/cm²) for 60 minutes, to give a copper-clad laminate for printed circuit board. Then, a circuit pattern was formed on the surface of the copper-clad laminate by leaving circuit pattern-forming regions and removing the other regions thereof by etching, and thereby a printed circuit board carrying a circuit on the surface was obtained.

The copper-clad laminates and the printed circuit boards for Examples 2 to 6 and Comparative Examples 1 to 2 were respectively obtained in the same way as the above-mentioned method for producing the copper-clad laminate and the printed circuit board of Example 1.

The properties of the copper-clad laminates obtained in Examples 1 to 6 and Comparative Examples 1 to 2 were respectively determined by the following evaluation tests.

[Solder Floating]

The sample was kept floating on a solder bath of 288° C. for the time indicated in Table 1 and, then blister of the sample was visually observed.

[Peeling Strength of Copper Foil]

A 1 oz of copper foil on the copper-clad laminate was peeled off for determination of its 90° peel strength (JIS-C-6481).

[Glass Transition Temperature]

The glass transition temperature (Tg) was measured as peak temperature of tan δ at 1 Hz by a dynamic mechanical analyzer manufactured by Seiko Instruments, Inc.

[Thermal Decomposition Temperature]

A resin was separated from a copper-clad laminate and analyzed in a thermogravimetric and differential thermal analyzer (TG-DTA). The programmed heating rate was 5° C./minute. The thermal decomposition temperature was a temperature at which the weight of the sample decreased by 5% from the initial weight.

[Flame Retardancy]

The flame retardancy of a copper-clad laminate was evaluated by the method specified in UL 94. The UL 94 is a vertical burn test that classifies materials as V-0, V-1 or V-2.

[Breaking Tenacity]

The laminate was set on a flat stage of the analyzer, and a vertical force was exerted on the laminate with a cross-shaped metal tool directly contacting with the surface of the laminate for 1 minute, which left a cross-shaped mark on the surface of the laminate. Breaking tenacity was evaluated by visually observing the cross-shaped mark on the surface of the laminate as follows: good: no white crease; normal: occurrence of slightly white crease; and bad: occurrence of cracking or breakage.

[Dielectric Properties]

The dielectric constant and the dissipation factor at 1 GHz were measured according to the procedures of ASTM D150-87.

[Resin Flow]

The resin flow property was determined by weighing a 4 inch squares of prepreg, punching the prepreg at a pressure and cutting a circular section of diameter 3.192 inch from the center of the prepreg, weighing the prepreg after removing the resin dust from the punching process and calculating the difference in weight.

The halogen-free flame-retardant epoxy resin composition of the present invention, and the test results of the test items above are summarized in Table 1.

balanced properties and every required performance for use as printed circuit boards when a primary amine (e.g. diaminodiphenylsulfone, DDS) is additionally added to the epoxy resin composition of the present invention.

As compared with Examples 1 to 6 of the present invention, the copper-clad laminate of Comparative Example 1 (in that poly(m-phenylene methylphosphonate) is not used) in the epoxy resin composition of the present invention) is brittle and exhibits poor breaking tenacity, and the copper-clad laminate of Comparative Example 2 (in that the weight ratio of poly(m-phenylene methylphosphonate) to the copolymer of styrene and maleic anhydride is not in the range of 2:1 to 4:1) has relatively low solder floating resistance, relatively low peeling strength of copper foil, and relatively large dielectric constant.

Thus, the copper-clad laminates or the printed circuit boards of the present invention can be used with high reliability. Accordingly, the copper-clad laminates or the printed circuit boards of the present invention prepared from the

TABLE 1

Epoxy Resin Compositions

| Relative to 100 parts by weight of the epoxy resin | | Example 1 | Example 2 | Example 3 | Example 4 | Example 5 | Example 6 | Comparative Example 1 | Comparative Example 2 |
|---|---|---|---|---|---|---|---|---|---|
| Halogen-Free Epoxy resin | DOPO-PNE | 100 | 100 | 100 | 100 | 100 | 100 | 100 | 100 |
| Composite curing agent | SMA | 15 | 15 | 15 | 20 | 10 | 10 | 15 | 15 |
| | PMP | 40 | 30 | 60 | 54 | 27 | 30 | 0 | 70 |
| | DDS | 0 | 0 | 0 | 10 | 0 | 5 | 0 | 0 |
| curing accelerator | 2MI | 0.5 | 0.5 | 0.5 | 0.5 | 0.25 | 0.5 | 0.5 | 0.5 |
| Inorganic filler | Silica | 15 | 15 | 15 | 15 | 15 | 15 | 15 | 15 |
| Solvent | MEK | 30 | 30 | 30 | 30 | 30 | 30 | 30 | 30 |

Test Results

| Properties | Conditions | Unit | Example 1 | Example 2 | Example 3 | Example 4 | Example 5 | Example 6 | Comparative Example 1 | Comparative Example 2 |
|---|---|---|---|---|---|---|---|---|---|---|
| Solder floating | 288° C. | min | >10 | >10 | 8.5 | 9.3 | 9.0 | 9.6 | >10 | 7.5 |
| Peeling strength (1 oz) | | lb/in | 7.9 | 8.2 | 7.5 | 8.1 | 8.0 | 7.8 | 8.5 | 7.2 |
| Glass transition temperature | DMA | ° C. | 155.3 | 152.3 | 151.3 | 156.5 | 144.5 | 150.5 | 155.3 | 150.4 |
| Thermal decomposition temperature | TGA | ° C. | 355.4 | 358.2 | 351.2 | 358.1 | 349.3 | 353.9 | 342.9 | 352.1 |
| Flame retardancy | rating | UL94 | V-0 | V-0 | V-0 | V-0 | V-0 | V-0 | V-0 | V-0 |
| Breaking tenacity | | | GOOD | GOOD | GOOD | GOOD | GOOD | GOOD | BAD | GOOD |
| Dielectric constant | Dk at 1 GHz | | 4.51 | 4.48 | 4.57 | 4.57 | 4.53 | 4.54 | 4.38 | 4.85 |
| Dissipation factor | Df at 1 GHz | | 0.011 | 0.011 | 0.013 | 0.011 | 0.013 | 0.013 | 0.010 | 0.011 |
| Resin flow | 4*4 inch$^2$ | g | <0.01 | <0.01 | <0.01 | 0.011 | <0.01 | <0.01 | 0.6 | <0.01 |

As seen from Table 1, the copper-clad laminates obtained according to the present invention (Examples 1 to 6) have the well-balanced properties and every required performance for use as printed circuit boards. These copper-clad laminates are excellent in solder floating, peeling strength of copper foil, heat resistance, breaking tenacity, and dielectric properties. It is worthy of note that the problem of brittleness of the prepregs, which occurs when styrene-maleic anhydride copolymer is used as epoxy curing agent, can be prevented when using the epoxy resin compositions of the present invention, especially in the case of Examples 1, 2, 3, 5, and 6, in the manufacture of prepregs. The copper-clad laminates obtained according to Examples 4 and 6 still have the wellepoxy resin composition with a copolymer of styrene and maleic anhydride, and poly(m-phenylene methylphosphonate) mixed in a certain proportion are excellent in peeling strength of copper foil, heat resistance, breaking tenacity, dielectric properties, and toughness.

It is contemplated that various modifications may be made to the compositions, prepregs, laminates and printed circuit boards of the present invention without departing from the spirit and scope of the invention as defined in the following claims.

What is claimed is:

1. A halogen-free flame-retardant epoxy resin composition comprising:

(A) a halogen-free epoxy resin having at least two epoxy groups in one molecule;
(B) 10.0 to 20.0 parts by weight of a copolymer of styrene and maleic anhydride as a first curing agent, based on 100 parts by weight of the halogen-free epoxy resin, the copolymer of styrene and maleic anhydride being represented by the following general formula (I):

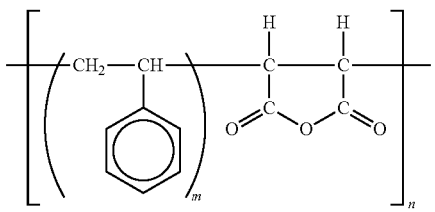

(I)

wherein m is an integer of 1 to 6, and n is an integer of 2 to 12; and
(C) 25.0 to 70.0 parts by weight of poly(m-phenylene methylphosphonate) as a second curing agent, based on 100 parts by weight of the halogen-free epoxy resin, poly(m-phenylene methylphosphonate) being represented by the following general formula (II):

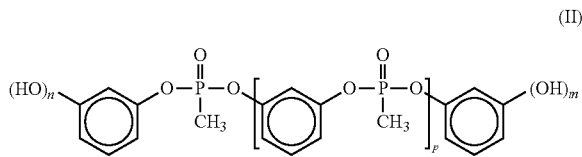

(II)

wherein m and n are 0 or 1, and p is an integer such that the number average molecular weight is less than 1000,
a weight ratio of poly(m-phenylene methylphosphonate) to the copolymer of styrene and maleic anhydride being 2.7:1.

2. The halogen-free flame-retardant epoxy resin composition as claimed in claim 1, wherein the halogen-free epoxy resin is one of a nitrogen-containing epoxy resin, and a phosphorus-containing epoxy resin.

3. The halogen-free flame-retardant epoxy resin composition as claimed in claim 2, the nitrogen-containing epoxy resin includes a benzoxazine-epoxy resin.

4. The halogen-free flame-retardant epoxy resin composition as claimed in claim 2, the phosphorus-containing epoxy resin includes DOPO-PNE which is obtained by reacting 10-dihydro-9-oxa-10-phosphahenanthrene-10-oxide (DOPO) with phenol novolac epoxy resin (PNE).

5. The halogen-free flame-retardant epoxy resin composition as claimed in claim 1, further comprising a primary amine as a third curing agent.

6. The halogen-free flame-retardant epoxy resin composition as claimed in claim 5, wherein the primary amine includes at least one of diaminodiphenylsulfone, and dicyandiamide.

7. The epoxy resin composition as claimed in claim 1, further comprising a curing accelerator.

8. The epoxy resin composition as claimed in claim 7, wherein the curing accelerator is present in an amount of 0.01 to 1.00 parts by weight, based on 100 parts by weight of the halogen-free epoxy resin.

9. The epoxy resin composition as claimed in claim 8, wherein the curing accelerator is an imidazole.

10. The epoxy resin composition as claimed in claim 1, further comprising an inorganic 11. The epoxy resin composition as claimed in claim 10, wherein the inorganic filler is present in an amount of 5 to 30 parts by weight, based on 100 parts by weight of the halogen-free epoxy resin.

12. The epoxy resin composition as claimed in claim 11, wherein the inorganic filler includes talc, and aluminium hydroxide.

13. A prepreg produced by impregnating a reinforcing material with the halogen-free flame-retardant epoxy resin composition according to claim 1 to form an impregnated substrate, and drying the impregnated substrate to a semi-cured state.

14. A printed circuit board produced by laminating a particular number of the prepregs according to claim 13 to form a prepreg laminate, and forming a metal foil on at least one outermost layer of the prepreg laminate and heat pressure-molding the prepreg laminate to form a metal-clad laminate, and forming a circuit pattern on a surface of the metal foil on the metal-clad laminate.

* * * * *

UNITED STATES PATENT AND TRADEMARK OFFICE
CERTIFICATE OF CORRECTION

| | | |
|---|---|---|
| PATENT NO. | : 8,581,107 B2 | Page 1 of 1 |
| APPLICATION NO. | : 12/856123 | |
| DATED | : November 12, 2013 | |
| INVENTOR(S) | : Hsu | |

It is certified that error appears in the above-identified patent and that said Letters Patent is hereby corrected as shown below:

In the Claims

Column 12, lines 23-24 (claim 10) should read:

10. The epoxy resin composition as claimed in claim 1, further comprising an inorganic filler.

Signed and Sealed this
Twenty-fourth Day of June, 2014

Michelle K. Lee
*Deputy Director of the United States Patent and Trademark Office*